United States Patent [19]

Carlton et al.

[11] Patent Number: 4,994,737
[45] Date of Patent: Feb. 19, 1991

[54] SYSTEM FOR FACILITATING PLANAR PROBE MEASUREMENTS OF HIGH-SPEED INTERCONNECT STRUCTURES

[75] Inventors: Dale E. Carlton, Portland; Keith E. Jones, Aloha; Thomas A. Myers, Beaverton, all of Oreg.

[73] Assignee: Cascade Microtech, Inc., Beaverton, Oreg.

[21] Appl. No.: 491,569

[22] Filed: Mar. 9, 1990

[51] Int. Cl.$^5$ ............................................. G01R 19/10
[52] U.S. Cl. ............................ 324/158 P; 324/158 R; 333/246
[58] Field of Search ............... 324/158 F, 158 P, 73.1, 324/72.5; 333/246, 238; 439/68, 70; 174/268; 338/307, 309

[56] References Cited

U.S. PATENT DOCUMENTS

| | | | |
|---|---|---|---|
| 3,573,617 | 4/1971 | Randolph et al. | 324/158 F |
| 4,684,884 | 8/1987 | Soderlund | 324/158 R |
| 4,697,143 | 9/1987 | Lockwood et al. | 324/158 P |
| 4,706,050 | 11/1987 | Andrews | 333/246 |
| 4,734,641 | 3/1988 | Byrd, Jr. et al. | 324/158 R |
| 4,858,160 | 8/1989 | Strid et al. | 324/158 P |
| 4,899,126 | 2/1990 | Yamaha | 338/307 |
| 4,901,012 | 2/1990 | Gloanec et al. | 324/158 R |

OTHER PUBLICATIONS

Carlton, D. E., et al., "Accurate Measurement of High--Speed Package and Interconnect Parasitics", IEEE 1988 Custom Integrated Circuits Conference, Jan. 1988, vol. CH2584-1/88/000-0138, pp. 23.3.1-23.3.7.
Cascade Microtech, Inc., "Electrical Operation", Model 42-42D Microwave Probe Station Instruction Manual, Chap. 4, at 4-1 to 4-42, (12/1987).

Primary Examiner—Kenneth Weider
Assistant Examiner—Vinh P. Nguyen
Attorney, Agent, or Firm—Chernoff, Vilhauer, McClung & Stenzel

[57] ABSTRACT

An adapter, having a dielectric substrate upon which are mounted an array of uniformly-spaced, coplanar conductive strips and impedance standards having similarly spaced coplanar leads, facilitates planar transmission line probe measurements of the high-speed electrical characteristics of a package or other interconnect structure for a high-speed integrated circuit. The conductive strips of the adapter are connected to the terminals of the package so as to simulate the integrated circuit connection, that is, with substantially identical length and spacing of bond wires. The planar probe, by contacting the conductive strips of the adapter, is able to measure the electrical characteristics of the package including the bond wires, thereby providing realistic measurements of the integrated circuit's environment. The impedance standards on the adapter are specially designed to enable the effects of the adapter to be removed from the measurements by calibration.

19 Claims, 2 Drawing Sheets

SYSTEM FOR FACILITATING PLANAR PROBE MEASUREMENTS OF HIGH-SPEED INTERCONNECT STRUCTURES

BACKGROUND OF THE INVENTION

This invention relates to the measurement of high-speed electrical characteristics of integrated circuit packages and other interconnect structures for interfacing with high-speed integrated circuits.

Predicting the performance of subnanosecond integrated circuits requires accurate measurement of the electrical characteristics of the package or other interconnect structure which interfaces the integrated circuit with the larger circuit of which it is a part. Such measurements are necessary because the electrical characteristics of the package or other interconnect structure can dominate the performance limits of a high-speed integrated circuit. Time domain reflectometry and network analysis measurements must typically be performed to determine the following electrical characteristics of such interconnect structures:

(a) loss by radiation into the surrounding dielectric;
(b) electrical resonances caused by the interaction of parasitic capacitance and inductance in the signal path;
(c) spectral dispersion when energy storage by parasitic capacitance and inductance causes higher frequencies to be attenuated more quickly, thereby degrading signal edges; and
(d) cross coupling with neighboring lines when capacitive and inductive coupling causes pick-up of signals carried on a nearby conductor track.

The principal problem with obtaining the foregoing measurements involves establishing an effective electrical connection to the terminals of the package or other interconnect structure. In the past, special purpose fixtures have been constructed for this purpose, but such fixtures require labor-intensive construction, provide little or no test configuration versatility for adaptation to different interconnect structures, and often introduce errors into the measurements because of their own electrical characteristics.

An improved approach which seeks to cure at least some of these deficiencies is described in Carlton, D. E. et al., "Accurate Measurement of High-Speed Package and Interconnect Parasitics," *IEEE* 1988 *Custom Integrated Circuits Conference,* Jan. 1988, vol. CH2584-1/88/000-0138, pp. 23.3.1–23.3.7. This article discusses the use of a planar transmission line probe, such as that described in U.S. Pat. No. 4,697,143, to contact the terminals of a package or other interconnect structure directly. This approach provides a less labor-intensive and more versatile connection system. It also provides a way of removing, by calibration, probe and cable-related errors from the measurements by using impedance standards with known electrical characteristics such as resistors, short-circuits, and through-connections mounted on an "impedance standard substrate," as described further in Cascade Microtech, Inc., "Electrical Operation," *Model* 42-42D *Microwave Probe Station Instruction Manual,* chap. 4, at 4-1 to 4-42 (1987). The mathematics for the calibration operation are well known in the industry and are described, for example, in the foregoing Cascade Microtech instruction manual and in U.S. Pat. No. 4,858,160 which are incorporated herein by reference, as well as in the following technical articles which are also incorporated herein by reference: Swanson, D., "Ferret Out Fixture Errors with Careful Calibration," *Microwaves,* Jan. 1980, at 79–84; Fitzpatrick, J., "Error Models for Systems Measurement," *Microwave Journal,* May 1978, at 63–66.

However, even with the foregoing improved approach, the following significant deficiencies remain:

(a) some packages and other interconnect structures have terminals mechanically inaccessible to direct contact by a planar transmission line probe, either because the depth and width of a package well makes the internal terminals inaccessible or because the terminals are not sufficiently coplanar for effective simultaneous contact by such a probe;
(b) different packages and other interconnect structures have a wide variety of signal and ground terminal spacings, which therefore require corresponding different probes with different signal and ground contact spacings to mechanically interface therewith;
(c) the complex effects of various lengths, spacings, and multiplicities of interface structures, such as bond wires, used to connect the integrated circuit to the terminals of the interconnect structure cannot be included in the measurements.
(d) a signal or power terminal of an interconnect structure, which is not located adjacent to any ground terminal, cannot be contacted effectively by a planar probe because the probe tip contact spacing cannot span the distance between the signal or power terminal and the nearest available ground terminal.

SUMMARY OF THE PRESENT INVENTION

The present invention provides a system, for facilitating planar probe measurements of high-speed packages and other interconnect structures, which overcomes all of the above-mentioned deficiencies of the prior systems.

The invention provides a probe connection method and apparatus which employs a unique adapter having a plurality of spaced-apart, substantially coplanar side-by-side conductive strips on a dielectric substrate, such strips preferably forming multiple controlled-impedance transmission lines. Respective ones of the strips are connected to respective ones of the terminals of the package, or other interconnect structure to be measured, by bond wires or other suitable connections. A planar, controlled-impedance transmission line probe is selected having coplanar contacts spaced to match the spacing of the conductive strips on the adapter, so that the probe may interface compatibly in turn with different selected groups of strips on the adapter regardless of the terminal spacing or other configuration of the interconnect structure to be measured. This overcomes the previous problem wherein certain terminals of the interconnect structure are mechanically inaccessible to a planar probe, either because of the package well configuration or the lack of sufficiently coplanar terminals. It also solves the problem of requiring a different probe for each different terminal spacing of an interconnect structure to be measured.

The spacing of the conductive strips on the adapter, and the resultant matched spacing of the coplanar contacts of the probe, are preferably selected to match the connecting pad spacing of the particular integrated circuit intended to be used with the package or other interconnect structure, so that the adapter simulates the integrated circuit. Moreover, the adapter is preferably connected to the terminals of the package in a position such that the distance separating the package terminals from the conductive strips of the adapter is the same distance as that intended to separate the terminals from the connecting pads of the integrated circuit. Furthermore, the connect,ions (such as bond wires) between the package terminals and the conductive strips of the adapter are preferably identical to those intended to interconnect the package terminals and the connecting pads of the selected integrated circuit. These individual simulations enable the adapter to simulate all of the significant variables of the actual interface between the integrated circuit and the package terminals, thereby permitting the interface to be included in the measurements so that the measurements are accurately representative of the total environment surrounding the integrated circuit.

The other previous problem, wherein certain signal or power terminals not adjacent to a ground terminal of a package could not be contacted effectively by a planar probe, is solved by interconnecting numerous ones of the conductive strips of the adapter so that the interconnected strips can serve as ground references adjacent to each signal or power strip of the adapter, for convenient contact by the probe. The interconnected ground reference strips are readily connectible by one or more bond wires to the ground reference terminal or terminals of the package or other interconnect structure, regardless of where the ground reference terminals are located. Preferably, the interconnected ground reference strips on the adapter are positioned alternately between other conductive strips which are not so interconnected and thus serve as signal or power conductors, so as to maximize the accessibility of a ground reference strip when contacting any signal or power strip with a probe.

The use of the adapter of the present invention adds a new element (the adapter) to the measurement network which, in itself, could be a source of error due to its own effects on the measurements. Accordingly, it is desirable to remove the effects of the adapter from the measurements by calibration. Conventional impedance standards used for probe calibration, such as those provided on an "impedance standard substrate" as described previously, are not suitable for removing the effects of the adapter from the measurements. Such impedance standards merely enable calibration at the probe tip contacts, whereas accurate measurements of the total environment of an integrated circuit require calibration at the points where the bond wires connect to the integrated circuit. Such a discrepancy would create a source of error in the conductive strips of the adapter which are interposed between the probe contacts and the bond wire attachment points. To enable the removal of this source of error, the adapter includes its own special impedance standards, each having a plurality of spaced-apart substantially coplanar conductive le having a spacing substantially the same as that of the conductive strips on the adapter and, preferably, having lead portions which are duplicative of those portions of the conductive strips where the source of error is likely to occur. The provision of these special impedance standards enables a probe to be placed in contact with the impedance standards with a built-in offset, relative to the standards, duplicative of the offset which will exist relative to the bond wires when the probe is ultimately placed in contact with the conductive strips to perform the measurements. Thus, calibration using the adapter's special impedance standards removes the effect of the offset (i.e. the effect of the adapter) from the measurements, as well as the effects of the probe and cabling.

The foregoing and other objectives, features, and advantages of the invention will be more readily understood upon consideration of the following detailed description of the invention, taken in conjunction with the accompanying drawings.

Description of the Preferred Embodiment

Figure 1:
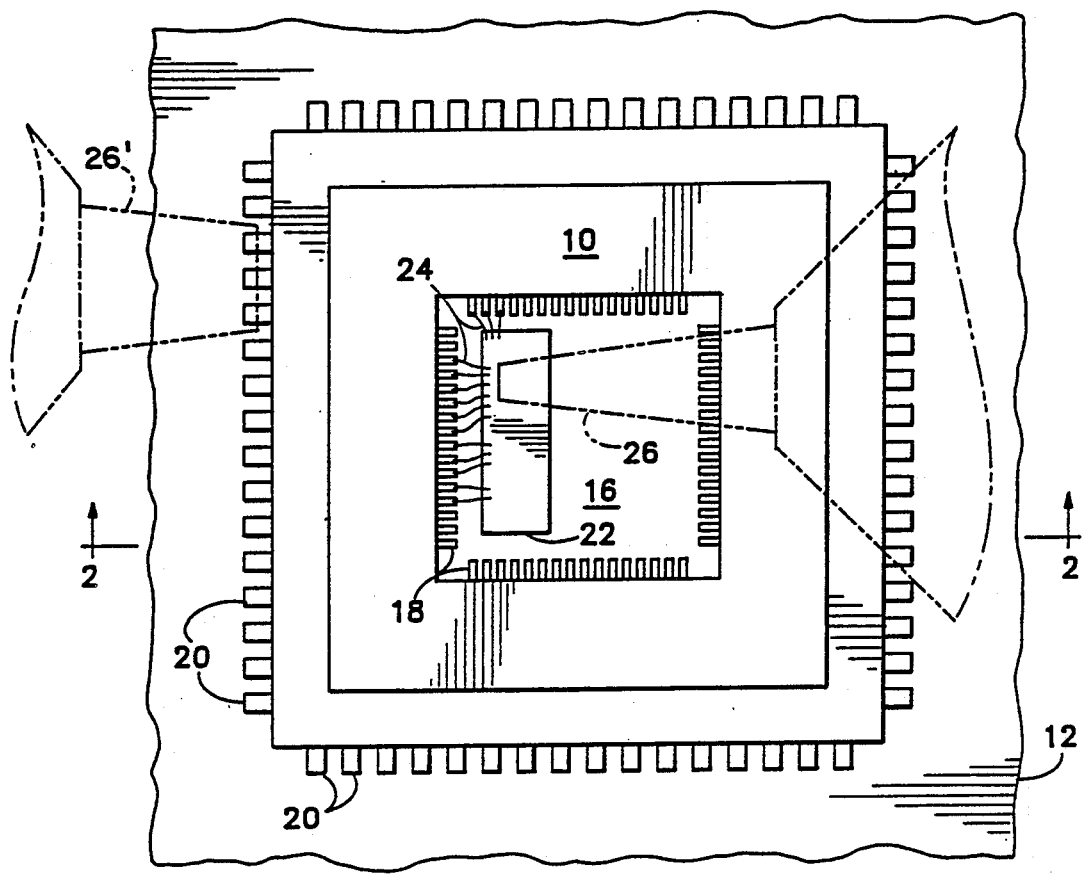
FIG. 1 is a plan view of an exemplary integrated circuit package, having an adapter connected by bond wires to the, inner terminals of the package in accordance with the invention.
Figure 2:
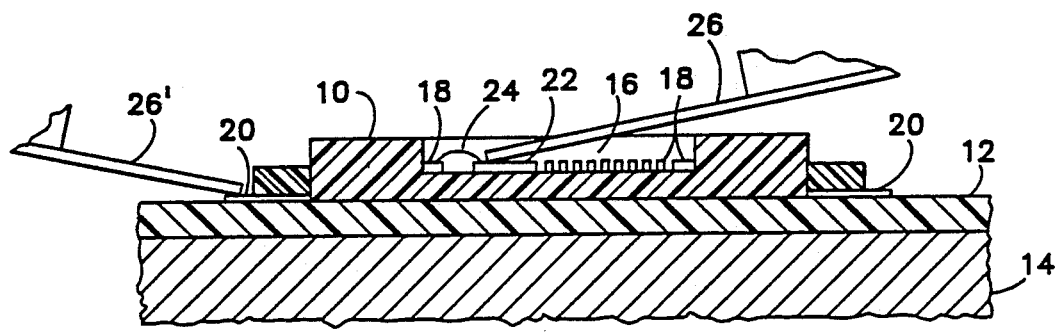
FIG. 2 is a cross-sectional view of the assembly of FIG. 1 taken along line 2—2 of FIG. 1.

With reference to FIGS. 1 and 2, an exemplary integrated circuit package 10 is mounted on a circuit board 12 which in turn is mounted on a chuck 14 of a conventional probe station. The package 10 comprises a recessed well 16 into which protrude surrounding arrays of internal package terminals 18 intended to be connected by bond wires or other suitable interface structures with an integrated circuit (not shown) to be positioned in the well 16. The package 10 also includes arrays of external terminals 20 for connection to the circuit board 12, each external terminal 20 being connected to a respective internal terminal 18.

Mounted within the well 16, in place of an integrated circuit, is an exemplary embodiment of an adapter 22 in accordance with the present invention. The adapter 22, which is more fully described hereafter, is connected by respective bond wires 24 to respective ones of the internal terminals 18 of the package 10. The purpose of the adapter 22 is to allow measurements of the electrical characteristics of the package 10 by enabling the contacts of one or more planar, controlled-impedance transmission line probes such as 26 to communicate with selected ones of the bond wires 24 and, through them, with the terminals 18 of the package 10. For one port measurements, only a single probe 26 is employed, whereas for two port measurements an additional probe 26' may be used to contact the external terminals 20 or other convenient points on the circuit board 12. Also, cross talk measurements can be performed by placing multiple probes in contact with the adapter 22 simultaneously from opposite directions.

Figure 3:
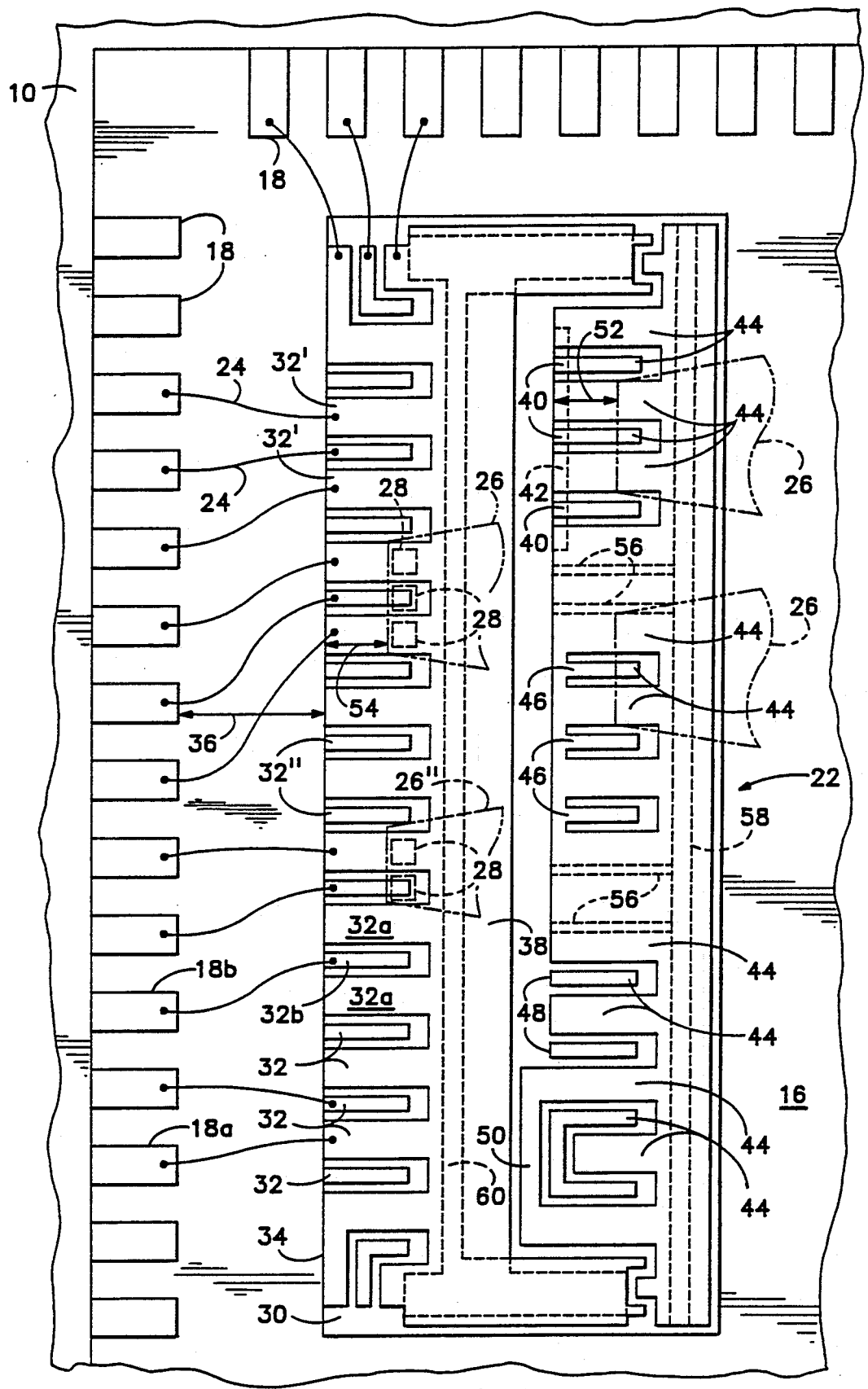
FIG. 3 is an enlarged detail view of a portion of FIG. 1 showing an exemplary embodiment of an adapter in accordance with the invention.

All of the probes referred to herein are preferably wafer probes of the coplanar controlled-impedance transmission line type as described, for example in U.S. Pat. No. 4,697,143 which is incorporated herein by reference, and comprise tapered dielectric probe boards having ground and signal conductors on their bottom surfaces converging toward a tip where they are terminated by a plurality of spaced-apart, substantially coplanar contacts 28 (FIG. 3). Alternatively, other types of planar controlled-impedance transmission line probes, such as multiplane microstrip probes, terminated at their tips by coplanar contacts could be employed. The number of contacts and corresponding transmission line conductors on a probe can vary from as little as one ground reference and one signal contact, as shown on probe 26" in FIG. 3, to an array of contacts having alternating signal and ground reference contacts. A probe having one signal contact positioned between a pair of ground reference contacts, as depicted on probe 26 in FIG. 3, is a common arrangement.

With further reference to FIG. 3, the adapter 22 comprises a dielectric substrate 30 having an array of spaced-apart, substantially coplanar conductive strips 32, preferably of gold, deposited thereon. The conductive strips 32 are arranged in side-by-side relationship with a uniform, center-to-center spacing forming multiple controlled-impedance transmission lines, and with their ends in alignment with one another along the edge 34 of the adapter. The center-to-center spacing of the strips 32 is selected so as to match the center-to-center spacing of the connecting pads of the particular integrated circuit to be connected to the terminals 18 of the package 10. In addition, the position of the adapter 22 relative to the terminals 18 of the package is selected so that the distance 36 separating the package terminals 18 from the conductive strips 32 is the same distance as that intended to separate the terminals 18 from the connecting pads of the selected integrated circuit. Also the connecting bond wires 24 between the package terminals 18 and the conductive strips 32 are selected so as to be identical to those intended to interconnect the package terminals and the connecting pads of the selected integrated circuit.

The array of conductive strips 32 on the adapter 22 is arranged such that a group of wider strips 32', interconnected on the substrate 30 at their bases by conductive material 38, are interposed alternately between narrower conductive strips 32" which are not so interconnected. The interconnected wider strips 32' are intended to serve as ground references located conveniently adjacent to the respective strips 32" which are intended to serve as signal or power terminals. By connecting one or more of the strips 32' by a respective bond wire 24 to any ground reference terminal such as 18a of the package 10, all of the strips 32' thereby become ground references whether or not they are directly connected by their own bond wires to a ground reference terminal of the package. This arrangement permits a signal terminal such as 18b of the package 10, which is not conveniently adjacent to any ground reference terminal of the package, nevertheless to be measured by contacting the corresponding signal strip 32b of the adapter 22 with the central signal contact 28 of a probe 26, while the outer ground reference contacts of the probe 26 simultaneously contact the ground reference strips 32a on either side of the signal strip 32b.

To enable calibration of the probe connection by removing not only the effect of the probe and cabling from the measurement, but also the effects of the adapter 22, a special set of impedance standards is provided on the dielectric substrate 30 of the adapter 22, insulated electrically from the conductive strips 32. The impedance standards include a 50 ohm resistance standard 40, comprising a length of resistive material 42, with spaced conductive leads 44 of the same conductive material as strips 32 overlying the resistive material 42 such that the tips of the leads 44 are conductively interconnected by the resistive material 42. Other impedance standards include a short-circuit standard 46 having similar conductive leads 44 interconnected at their tips by the same conductive material, and an open-circuit standard 48 with leads 44 having no interconnection at their tips. A through-connection standard 50 is also provided having similar leads 44. The impedance standards 40, 46, 48 and 50 would be conventional if it were not for the presence of the conductive leads 44 attached to them, which have a center-to-center spacing substantially identical to that of the conductive strips 32 and, preferably, have at least portions thereof which are duplicative of corresponding portions of the conductive strips 32 as shown in FIG. 3. Calibration is carried out by means of measurements of the impedance standards, and resultant calculations of error factors in accordance with known mathematical techniques referred to in the Background of the Invention. The probe 26 contacts the leads 44 displaced from the respective impedance standards by a distance, such as 52, equal to the distance 54 by which the probe will be displaced from the various points of connection of the bond wires 24 to the conductive strips 32 during the subsequent actual measurements of the electrical characteristics of the package. The equality of the displacement distances 52 and 54, coupled with the duplicative nature of the leads 44 relative to the strips 32, causes the effects of the conductive strips 32 to be included in the calibration measurements of the impedance standards. Such inclusion during the calibration process thereby effectively removes the effects of the strips 32, and thus of the adapter 22, from the subsequent actual measurements, together with the effects of the probe and its cabling. Conversely, the effects of the bond wires 24, with their accurately representative lengths and spacings, are desirably included in the actual measurements together with the effects of the package 10.

In addition to the resistive material 42 used in the resistance standard 40, other resistive material underlies the conductive strips and conductive leads of the adapter 22. This includes resistive material 56 between the respective different impedance standards, resistive material 58 adjacent the bases of the respective conductive leads 44, and resistive material 60 adjacent the bases of the respective conductive strips 32. The resistive material, which may be of any suitable composition such as tantalum nitride or nickel chromium alloy, is employed at 56, 58 and 60 primarily for the purpose of damping ground resonances in the adapter 22.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of establishing a probe connection, for facilitating the measurement of the high-speed electrical characteristics of an interconnect structure having terminals thereon for conductively interfacing with spaced-apart connecting pads of a high-speed integrated circuit, said method comprising:

(a) providing an adapter, comprising a plurality of spaced-apart, substantially coplanar conductive strips on a dielectric substrate;

(b) connecting respective ones of said conductive strips of said adapter to respective ones of said terminals of said interconnect structure;

(c) providing a probe, comprising a controlled-impedance transmission line terminated at an end thereof by a plurality of spaced-apart, substantially coplanar contacts having a spacing substantially the same as that of said conductive strips of said adapter; and (d) conductively abutting respective ones of said contacts of said probe simultaneously with respective different ones of said conductive strips of said adapter to perform said measurement.

2. The method of claim 1, further including selecting a particular integrated circuit having a particular selected spacing of its connecting pads for connection to the terminals of said interconnect structure, and using said adapter to simulate said particular integrated circuit by providing said adapter with a spacing of said conductive strips which is substantially the same as said selected spacing of said connecting pads.

3. The method of claim 1, further including selecting a particular connected position of said integrated circuit relative to said interconnect structure whereby a particular selected distance separates said connecting pads of said integrated circuit from said terminals of said interconnect structure, and using said adapter to simulate said integrated circuit by positioning said adapter relative to said interconnect structure so that respective ones of said conductive strips of said adapter are separated by said selected distance from said terminals of said interconnect structure when connected thereto in step (b).

4. The method of claim 1, further including selecting a particular conductive interface structure for interfacing respective connecting pads of said integrated circuit with respective terminals of said interconnect structure, and using said adapter to simulate said integrated circuit by connecting respective ones of said conductive strips of said adapter to respective ones of said terminals of said interconnect structure in step (b) by means of a conductive interface structure substantially identical to said particular conductive interface structure.

5. The method of claim 1, wherein said adapter is capable of introducing electrical effects which can cause error in said measurement because of the connection of said adapted between said probe and said interconnect structure, further including calibrating said probe connection so as to remove from said measurement said electrical effects introduced by said adapter.

6. The method of claim 5, wherein said calibrating includes providing a plurality of different impedance standards on said dielectric substrate of said adapter, and conductively interconnecting said contacts of said probe with said impedance standards prior to step (d).

7. The method of claim 5 wherein said calibrating includes providing a plurality of different impedance standards having a plurality of spaced-apart, substantially coplanar conductive leads attached thereto, said leads having a spacing substantially the same as that of said conductive strips of said adapter, and conductively interconnecting said contacts of said probe with said impedance standards through said leads.

8. The method of claim 1 wherein said interconnect structure includes at least one ground reference terminal and wherein selected ones of said conductive strips of said adapter are conductively inter-connected at positions on said dielectric substrate, and wherein step (b) includes connecting the interconnected selected ones of said conductive strips of said adapter to said ground reference terminal of said interconnect structure.

9. The method of claim 1 wherein said interconnect structure is an integrated circuit package having a well surrounded by said terminals, and wherein step (b) includes positioning said adapter within said well.

10. A probe connection assembly, for facilitating the measurement of the high-speed electrical characteristics of an interconnect structure having terminals thereon for conductively interfacing with a high-speed integrated circuit, said assembly comprising:

(a) an adapter comprising a plurality of spaced-apart, substantially coplanar conductive strips on a dielectric substrate;

(b) means conductively connecting respective ones of said conductive strips of said adapter to respective ones of said terminals of said interconnect structure; and (c) a probe comprising a controlled-impedance transmission line terminated at an end thereof by a plurality of spaced-apart, substantially coplanar contacts having a spacing substantially the same as that of said conductive strips of said adapter, respective ones of said contacts of said probe conductively abutting respective different ones of said conductive strips of said adapter.

11. The assembly of claim 10 wherein said adapter further includes a plurality of different impedance standards on said dielectric substrate.

12. The assembly of claim 11 wherein each of said impedance standards has a plurality of spaced-apart, substantially coplanar conductive leads attached thereto having a spacing substantially the same as that of said conductive strips of said adapter.

13. The assembly of claim 10 wherein selected ones of said conductive strips of said adapter are conductively interconnected at positions on said dielectric substrate.

14. The assembly of claim 10 wherein said interconnect structure is an integrated circuit package having a well surrounded by said terminals, and wherein said adapter is positioned within said well.

15. The assembly of claim 10 wherein said means for connecting respective ones of said conductive strips of said adapter to respective ones of said terminals of said interconnect structure comprise respective bond wires.

16. An adapter for facilitating the measurement of the high-speed electrical characteristics of an interconnect structure having terminals thereon for conductively interfacing with a high-speed integrated circuit, said adapter comprising:

(a) an array of spaced-apart, substantially coplanar conductive strips on a dielectric substrate, said conductive strips being arranged in side-by-side relationship with a uniform spacing and having respective ends aligned with one another; and (b) respective different impedance standards on said dielectric substrate, each of said impedance standards having a plurality of spaced-apart, substantially coplanar conductive leads attached thereto which are separate from said conductive strips and have a spacing substantially the same as that of said conductive strips.

17. The adapter of claim 16 wherein respective ones of said conductive leads have portions which are duplicates of corresponding respective portions of said conductive strips.

18. The adapter of claim 16 wherein selected ones of said conductive strips are conductively interconnected at positions on said dielectric substrate.

19. The adapter of claim 18 wherein said selected ones of said conductive strips are positioned alternately between other ones of said conductive strips which are not conductively interconnected at positions on said dielectric substrate.

* * * * *

UNITED STATES PATENT AND TRADEMARK OFFICE
CERTIFICATE OF CORRECTION

PATENT NO. : 4,994,737

DATED : February 19, 1991

INVENTOR(S) : Dale E. Carlton et al.

It is certified that error appears in the above-identified patent and that said Letters Patent is hereby corrected as shown below:

Col. 3, line 7   Change "connect,ions" to --connections--

Col. 3, line 58  Change "le" to --leads--

Col. 4, line 14  Delete comma (,) after "the"

Col. 7, line 40  Change "adapted" to --adapter--

Col. 8, line 50  Change "differenct" to --different--

Signed and Sealed this

First Day of September, 1992

Attest:

DOUGLAS B. COMER

Attesting Officer

Acting Commissioner of Patents and Trademarks